(12) United States Patent
Sakane et al.

(10) Patent No.: US 9,953,665 B1
(45) Date of Patent: Apr. 24, 2018

(54) SYSTEMS AND METHODS FOR APPLYING ELECTRIC FIELDS DURING ULTRAVIOLET EXPOSURE OF LUBRICANT LAYERS FOR HARD DISK MEDIA

(71) Applicants: WD Media, LLC, San Jose, CA (US); Kansai University, Osaka (JP)

(72) Inventors: Yasuo Sakane, San Jose, CA (US); Hiroshi Tani, Osaka (JP)

(73) Assignees: Kansai University, Osaka (JP); WD Media, LLC, San Jose, CA (US)

( * ) Notice: Subject to any disclaimer, the term of this patent is extended or adjusted under 35 U.S.C. 154(b) by 0 days.

(21) Appl. No.: 14/147,739

(22) Filed: Jan. 6, 2014

Related U.S. Application Data

(60) Provisional application No. 61/914,471, filed on Dec. 11, 2013.

(51) Int. Cl.
*G11B 5/40* (2006.01)
*C23C 16/00* (2006.01)
*C23C 16/458* (2006.01)

(52) U.S. Cl.
CPC .......... *G11B 5/40* (2013.01); *C23C 16/00* (2013.01); *C23C 16/458* (2013.01)

(58) Field of Classification Search
CPC ...... C23C 16/458; C23C 16/4585; G11B 5/00
USPC ....... 427/488, 489, 490, 491, 525, 533, 534, 427/535, 536, 537, 538, 539, 562, 563, 427/564, 569, 580; 428/817, 844, 841, 428/841.3, 843.3, 833.6, 833.4, 833.3, 428/833.7, 840.4; 29/898.1; 118/500–503, 728–732; 156/345.51–345.53
See application file for complete search history.

(56) References Cited

U.S. PATENT DOCUMENTS

| | | | | |
|---|---|---|---|---|
| 4,567,073 A | * | 1/1986 | Larson | C08G 65/007 428/352 |
| 4,666,754 A | * | 5/1987 | Arioka et al. | 428/141 |
| 4,910,436 A | * | 3/1990 | Collins et al. | 315/111.81 |
| 5,750,747 A | * | 5/1998 | Furutani | C07C 43/126 252/62.54 |
| 6,096,385 A | * | 8/2000 | Yong | G11B 5/725 427/131 |
| 7,871,677 B2 | * | 1/2011 | Takakuwa | G11B 5/8404 427/569 |
| 8,389,067 B2 | | 3/2013 | Stirniman | |

(Continued)

OTHER PUBLICATIONS

JP 2010-198703—English translated, Y. Fujami.*

(Continued)

*Primary Examiner* — David P Turocy
*Assistant Examiner* — Mohammad Mayy
(74) *Attorney, Agent, or Firm* — Loza & Loza, LLP; Gabriel Fitch

(57) ABSTRACT

Systems and methods for applying electric fields during ultraviolet exposure of lubricant layers for hard disk media. One such method involves inserting a magnetic medium into a chamber, the magnetic medium including a lubricant on an outer surface thereof, and applying an electric field and an ultraviolet radiation to the lubricant within the chamber. Another such method involves inserting a magnetic medium into a chamber, depositing a lubricant on the medium within the chamber, and applying an electric field and an ultraviolet radiation to the lubricant within the chamber.

28 Claims, 7 Drawing Sheets

(56) References Cited

U.S. PATENT DOCUMENTS

| | | | |
|---|---|---|---|
| 2002/0089283 A1* | 7/2002 | Francke et al. | 313/539 |
| 2003/0067579 A1* | 4/2003 | Inoue | G02F 1/133788 |
| | | | 349/187 |
| 2005/0068667 A1* | 3/2005 | Burns | C10M 169/04 |
| | | | 360/99.08 |
| 2005/0271831 A1* | 12/2005 | Takakuwa | 427/595 |
| 2008/0075854 A1* | 3/2008 | Stirniman et al. | 427/248.1 |
| 2008/0144206 A1* | 6/2008 | Mryasov | B82Y 10/00 |
| | | | 360/59 |
| 2011/0127156 A1* | 6/2011 | Foad | G11B 5/8404 |
| | | | 204/192.12 |

OTHER PUBLICATIONS

J. D. Swalen, and F. Kajzar, Organic Thin Films for Waveguide Nonlinear Optics, 670-672, Gordon and Breach Publishers, V3, 1996.*
JP 02-182883, Pub date Jul. 17, 1990, Yurie, I.*
NPL, JP,2010-198703,A, english translated.*
Electric field, Wikipedia.*
H. Tani, et al., "Bonding Mechanism of Perfluoropolyether Lubricant Film with Functional Endgroup on Magnetic Disks by Ultraviolet Irradiation," Tribology Letters, ISSN 1023-8883, vol. 45, No. 1, pp. 118-122.

* cited by examiner

SYSTEMS AND METHODS FOR APPLYING ELECTRIC FIELDS DURING ULTRAVIOLET EXPOSURE OF LUBRICANT LAYERS FOR HARD DISK MEDIA

CROSS-REFERENCE TO RELATED APPLICATION(S)

This application claims priority to and the benefit of U.S. Provisional Application No. 61/914,471 filed on Dec. 11, 2013, and entitled, "SYSTEMS AND METHODS FOR APPLYING ELECTRIC FIELDS DURING UV EXPOSURE OF LUBRICANT LAYER FOR HARD DISK MEDIA", the entire content of which is incorporated herein by reference.

FIELD

The present invention relates generally to magnetic media for storage devices, and more specifically to systems and methods for applying electric fields during ultraviolet exposure of lubricant layers for hard disk media.

BACKGROUND

In a hard disk drive, a slider is often suspended just above a magnetic medium that is rotated to allow magnetic transducers in the slider to read (e.g., the reader) information from, and write (e.g., the writer) information to, the medium. The closer the slider can be positioned to the top surface of the medium/disk, which is typically a lubricant layer, the better the recording performance of the drive. Dynamic flying-height control technology involves positioning a heater within the slider that when activated can create a strategic bulge in the bottom surface (e.g., air bearing surface or ABS) of the slider thereby bringing the reader and the writer closer to the medium/disk top surface. The application of dynamic flying-height control technology can reduce the clearance of the magnetic heads (e.g., the reader and writer) from the disk surface to a few nanometers. However, lubricant pickup on the slider surface from the disk surface sometimes occurs as they are brought close together at the head disk interface (HDI) with a clearance of a few nanometers. This lubricant pickup can degrade the performance of the hard disk drive and/or cause it to fail.

Recently, ultraviolet (UV) treatment was applied to a lubricant coating on a carbon based overcoat layer of the media to increase the bonding ratio between the lubricant and the overcoat, and to thereby reduce lubricant pickup. One of the inventors studied the bonding mechanism of ultrathin perfluoropolyether (PFPE) lubricant films with hydroxyl end groups by measuring the bonding film thickness after UV irradiation (see article by H. Tani, et al., "Bonding Mechanism of Perfluoropolyether Lubricant Film with Functional Endgroup on Magnetic Disks by Ultraviolet Irradiation", Tribol. Lett. (2012) 45:117-122, the entire content of which is incorporated by reference herein). The results of this study suggest the occurrence of three kinds of mechanisms. First, lubricants with hydroxyl end groups bond because of the photo-dissociation of the end groups by the UV light. Second, they bond because of the interaction between the end groups and the photoelectron from the carbon surface generated by UV irradiation. Third, they bond because of the photo-dissociation of the main chain by the UV light. In contrast, the dynamic reaction coordinate calculations suggest that the end groups in the PFPE lubricant dissociate because of the electron capture by the lubricant. As a result, the study inferred that the bonding of PFPE lubricant films with hydroxyl end groups on magnetic disks occurs by selective dissociation of the end groups because of UV irradiation. So while UV irradiation may increase the bonding ratio to reduce lubricant pickup, there is room for further improvements in the lubricant bonding process. Accordingly, methods for further reducing or avoiding lubricant pickup by improved lubricant bonding are needed.

DETAILED DESCRIPTION

Figure 1A:
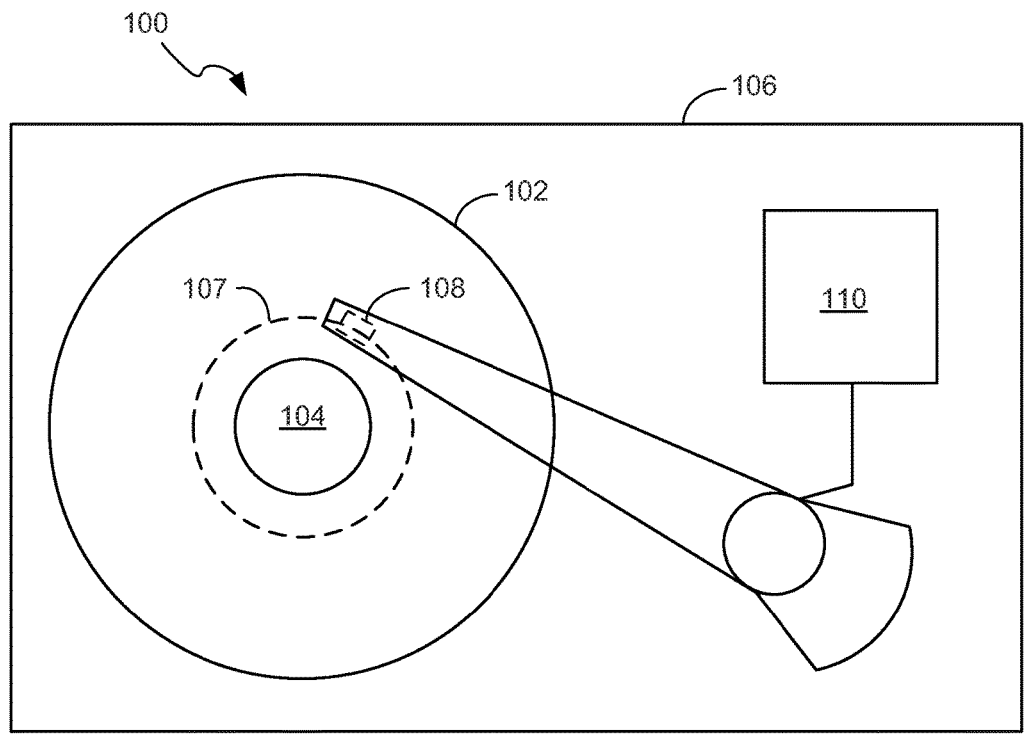
FIG. 1a is a top schematic view of a hard disk drive including a magnetic medium having an improved lubricant layer having been deposited with application of an electric field and ultra violet (UV) light in accordance with one embodiment of the invention.

The inventors have observed that if too much UV light is applied to the lubricant layer, or if the UV light is applied for too long, the lubricant layer can degrade or evaporate. Thus, it can be desirable to minimize the UV exposure while also maximizing the bonding strength. The inventors have further observed that if an electric field is applied during UV radiation as discussed herein, the efficiency of the photo-electron generation increases, thereby assisting the UV process and shortening the duration of the UV exposure. In particular, the applied electric field can enhance lubricant molecule orientation, which can lead to higher packing density for the lubricant layer.

Referring now to the drawings, embodiments of methods for forming a lubricant layer for a magnetic medium for a storage device involve applying both an electric field and UV radiation to the lubricant layer of a magnetic medium. For example, one such method involves inserting a magnetic medium into a chamber, where the magnetic medium already has a lubricant on an outer surface thereof, and applying an electric field and an ultraviolet radiation to the lubricant within the chamber. Another such method involves inserting a magnetic medium into a chamber, depositing a lubricant on the medium within the chamber, applying an electric field and an ultraviolet radiation to the lubricant within the chamber. Note that the terms UV light and UV radiation may be used interchangeably herein.

FIG. 1a is a top schematic view of a hard disk drive 100 including a magnetic medium 102 having an improved lubricant layer having been deposited with application of an electric field and ultra violet (UV) light in accordance with one embodiment of the invention. For heat assisted magnetic recording (HAMR), a near field transducer (NFT) can be positioned within a head/slider 108 that is suspended over the medium 102. Disk drive 100 may include one or more of the disks/media 102 to store data. Disks/media 102 reside on a spindle assembly 104 that is mounted to drive housing 106. Data may be stored along tracks 107 in the magnetic recording layer of disk 102. The reading and writing of data is accomplished with the head 108 that can have both read and write elements. The write element is used to alter the properties of the magnetic recording layer of disk 102 and thereby write information thereto. In one embodiment, head 108 may have magneto-resistive (MR), or giant magneto-resistive (GMR) elements. In an alternative embodiment, head 108 may be another type of head, for example, an inductive read/write head or a Hall effect head.

In operation, a spindle motor (not shown) rotates the spindle assembly 104, and thereby rotates disk 102 to position head 108 at a particular location along a desired disk track 107. The position of head 108 relative to disk 102 may be controlled by position control circuitry 110.

Figure 1B:
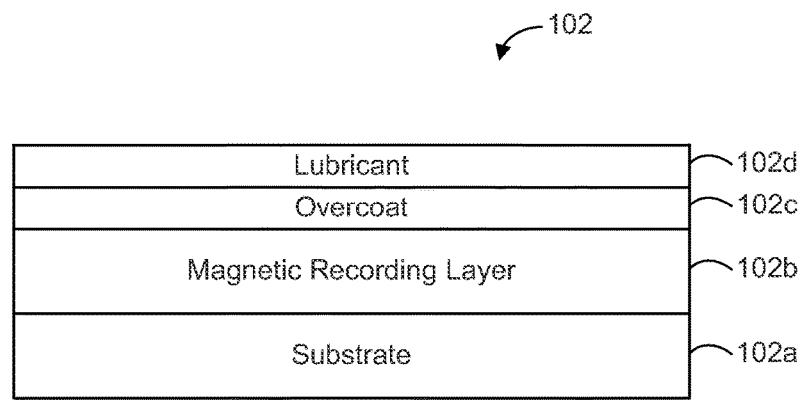
FIG. 1b is a schematic cross sectional view of the improved magnetic medium of FIG. 1 in accordance with one embodiment of the invention.

FIG. 1b is a schematic cross sectional view of the improved magnetic medium 102 of FIG. 1 in accordance with one embodiment of the invention. The improved magnetic medium 102 includes a stacked structure with a bottom or base substrate layer 102a, a magnetic recording layer 102b on the substrate 102a, an overcoat 102c on the magnetic recording layer 102b, and a lubricant layer 102d (e.g., a perfluoropolyether (PFPE) layer) on the overcoat layer 102c (e.g., a carbon based layer such as diamond like carbon or DLC). In several embodiments, the medium 102 can include one or more intervening layers between the depicted layers, including, for example, any of the layers that are known in the art to be used in such a magnetic medium.

In several embodiments, the lubricant layer 102d has been deposited or treated using the techniques disclosed herein, including, for example, application of UV light energy (e.g., radiation) and an electric field such that the lubricant layer 102d becomes densely packed and highly bonded to the overcoat 102c. In several embodiments, the medium 102 can be formed by providing the substrate 102a, forming the magnetic recording layer 102b on the substrate 102a, depositing the overcoat layer 102c on the magnetic recording layer 102b, depositing the lubricant layer 102d, and then applying UV radiation and the electric field to the lubricant layer 102d. In other embodiments, the last two actions (e.g., including the depositing the lubricant and the application of the UV light and the electric field to the lubricant) can be combined.

In several embodiments, the deposition of such layers can be performed using a variety of deposition sub-processes, including, but not limited to dipping, physical vapor deposition (PVD), sputter deposition and ion beam deposition, and chemical vapor deposition (CVD) including plasma enhanced chemical vapor deposition (PECVD), low pressure chemical vapor deposition (LPCVD) and atomic layer chemical vapor deposition (ALCVD). In other embodiments, other suitable deposition techniques known in the art may also be used.

The terms "above," "below," and "between" as used herein refer to a relative position of one layer with respect to other layers. As such, one layer deposited or disposed above or below another layer may be directly in contact with the other layer or may have one or more intervening layers. Moreover, one layer deposited or disposed between layers may be directly in contact with the layers or may have one or more intervening layers.

It shall be appreciated by those skilled in the art in view of the present disclosure that although various exemplary fabrication methods are discussed herein with reference to magnetic recording disks, the methods, with or without some modifications, may be used for fabricating other types of recording disks, for example, optical recording disks such as a compact disc (CD) and a digital-versatile-disk (DVD), or magneto-optical recording disks, or ferroelectric data storage devices.

Figure 2:
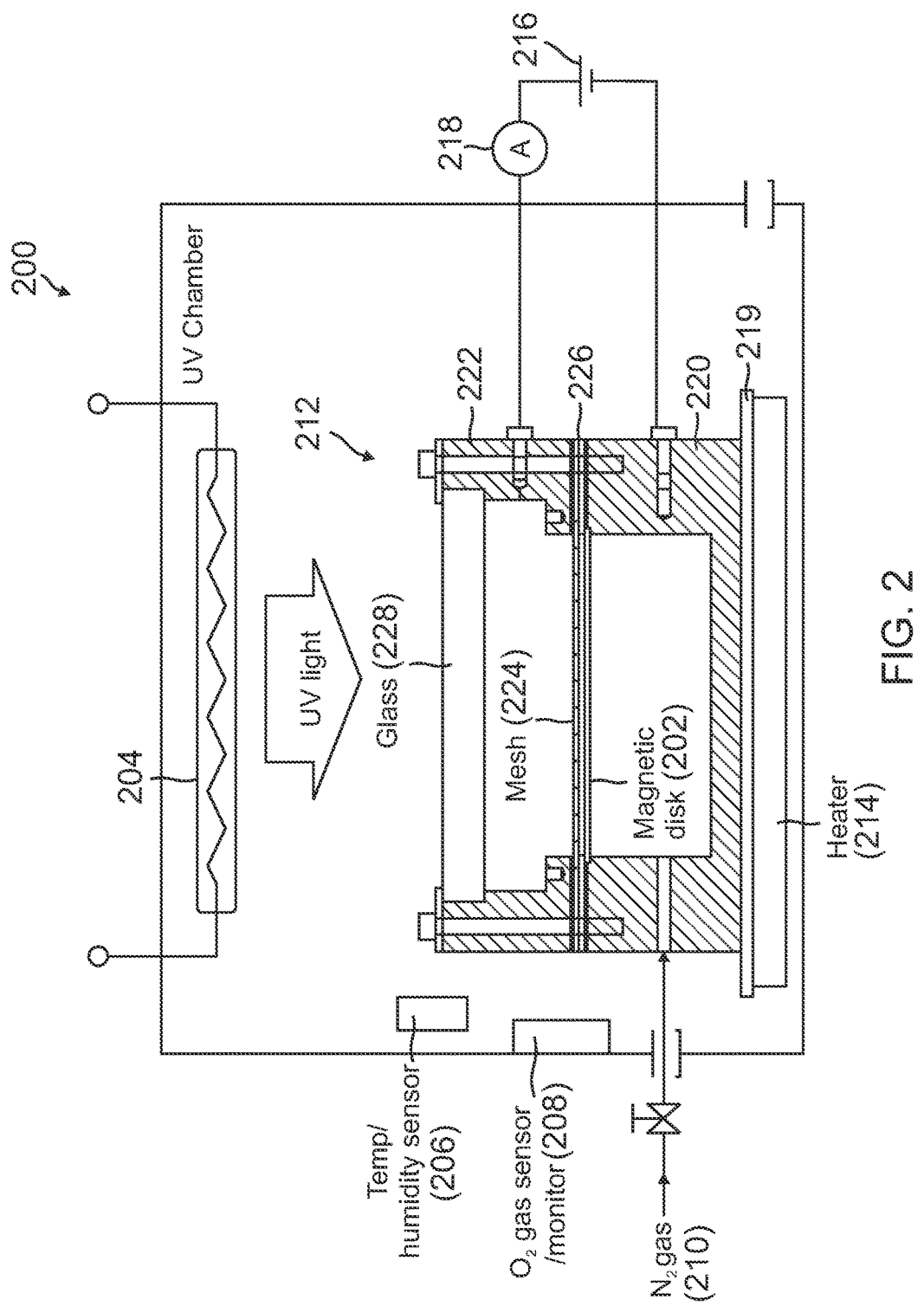
FIG. 2 is a schematic cross sectional view of a chamber for applying an electric field and ultra violet light to a magnetic medium already coated with a lubricant in accordance with one embodiment of the invention.

FIG. 2 is a schematic cross sectional view of a chamber 200 for applying an electric field and ultra violet light to a magnetic medium 202 already coated with a lubricant in accordance with one embodiment of the invention. The chamber 200 includes a UV light source 204 (e.g., configured to generate UV light at suitable wavelengths such as about 185 nanometers and/or about 254 nanometers), a temperature/humidity sensor 206, an oxygen sensor/monitor 208, a nitrogen gas flow controller 210, a sub-chamber 212, and a heater disposed 214 under the sub-chamber 212. A high voltage power supply 216 and an ammeter 218 are electrically connected to terminals of the sub-chamber 212 through a wall of the chamber 200.

The sub-chamber 212 includes a base portion 220 having a hollow cylindrical shape with a closed bottom and an open top, and thereby having a U-shaped cross section. The sub-chamber 212 further includes a cover portion 222 having a hollow cylindrical shape with an open bottom and an open top disposed on the base portion 220. An inner wall of the cylindrical base portion 220 includes a recess extending 360 degrees for receiving and retaining the magnetic medium 202.

The sub-chamber 212 further includes an electric mesh 224 having a disk shape with a diameter that extends roughly to the outer wall surface of the cylindrically shaped base portion 220 and a washer shaped insulating spacer 226. In the embodiment illustrated in FIG. 2, the mesh 224 can include an outer non-mesh ring portion that is conductive and an inner circular mesh portion such that a size of the inner mesh portion roughly corresponds to the size of the disk 202. The spacer 226 is positioned directly on a top surface of a cylinder wall of the base portion 220 and the electric mesh 224 (e.g., outer ring portion of the mesh 224) is positioned directly on the spacer 226. A bottom surface of the cylinder walls of the cover portion 222 is positioned directly on electric mesh 224 (e.g., outer ring portion of the mesh 224). An inner wall of the cylindrical cover portion 222 includes a recess near a top area thereof, where the recess extends 360 degrees along the inner wall for receiving and retaining a translucent glass disk 228 for enclosing the sub-chamber 212 and for allowing UV light to pass to the medium 202 within the sub-chamber 212.

The chamber 200 further includes an insulator 219 positioned between the heater 214 and base portion 220 of the sub-chamber 212.

A negative terminal of the voltage supply 216 is electrically connected to a terminal embedded in the base portion 220. A positive terminal of the voltage supply 216 is electrically connected to the ammeter 218 which is electrically connected to a terminal embedded in the cover portion 222. As such, the voltage supply 216, when applied, is configured to supply a negative voltage to be applied to the medium 202 which is electrically coupled to the base portion 220 and a positive voltage to be applied to the mesh 224 which is electrically coupled to the cover portion 222. The mesh 224 and medium 202 are insulated from one another by the insulating spacer 226.

In operation, the medium 202 can be inserted into the sub-chamber 212 such that the lubricant layer, already deposited/coated on the medium 202 in this case, is closest to the mesh 224 and thus faces the UV light from the UV light source 204. The UV light from the UV light source 204 can be applied to the lubricant layer of the medium 202. An electric field, generated by application of the high voltage of the voltage supply 216 to the mesh 224 and medium 202, can also be applied to the lubricant layer such that the direction of the electric field is directly into a top surface of the lubricant layer (e.g., about normal to the top surface). In several embodiments, the UV light/radiation and electric field are applied at about the same time. In other embodiments, the UV light/radiation and electric field are applied together for a preselected duration and also separately for preselected durations. In a number of embodiments, the electric field is applied for a preselected duration (e.g., about 1 nanosecond or more) before the UV light is applied. In such case, the electric field can orient molecules of the lubricant layer before the UV light begins to solidify the lubricant layer as a bonded layer.

In a number of embodiments, the heater 214 can be applied prior to the electric field and UV light to increase photoelectron emission (e.g., from the overcoat layer), and thereby make the lubricant bonding process more efficient. The heater 214 can also be used to control the evaporation of the lubricant (e.g., PFPE) vapor and the absorption of lubricant vapor on the medium surface. In some embodiments, such as in a production environment, no heater is used. In some embodiments, the UV light source 204 can act as a heater to heat the medium to a desired preselected temperature.

In one embodiment, the UV light source 204, the voltage supply 216, and other components (e.g., 206, 208, 210, 214, etc.) of the chamber 200 can be controlled by a processor. In this context, the processor refers to any machine or selection of logic that is capable of executing a sequence of instructions and should be taken to include, but not limited to, general purpose microprocessors, special purpose microprocessors, central processing units (CPUs), digital signal processors (DSPs), application specific integrated circuits (ASICs), signal processors, microcontrollers, and other suitable circuitry. Further, it should be appreciated that the term processor, microprocessor, circuitry, controller, and other such terms, refer to any type of logic or circuitry capable of executing logic, commands, instructions, software, firmware, functionality, or other such information.

In several embodiments, the base portion 220 and cover portion 222 are made of one or more conductive materials (e.g., aluminum). In a number of embodiments, the insulating spacer 226 is made of polytetrafluoroethylene (PTFE) or another suitable material. In several embodiments, the glass disk 228 is made of quartz or another suitable glass material. In one embodiment, the insulator 219 is made of aluminum nitrogen (AlN) or other suitable materials. In one embodiment, the UV light source 204 is a low pressure mercury lamp.

In one embodiment, the mesh 224 (e.g., the inner portion of the mesh 224) may have a rectangular grid pattern, a circular mesh pattern, or another suitable mesh pattern for facilitating generation of an electric field while allowing the UV radiation to penetrate the mesh. In several embodiments, the medium 202 has been coated with the lubricant using dipping prior to being inserted into the sub-chamber 212.

In several embodiments, the medium 202 can be manufactured in the manner discussed above in the description of FIG. 1a.

In several embodiments, the chamber 200 and the sub-chamber 212 can be thought of as atmospheric conditioning chambers and are not configured as vacuum chambers. In other embodiments, the chamber 200 and the sub-chamber 212 can be configured as vacuum chambers and specifically configured to facilitate lubricant deposition (e.g., vapor deposition) during application of UV radiation and an electric field. For example, in some embodiments, the sub-chamber 212 wall can include an opening such that vapor lubricant can be dispersed into the sub-chamber 212. In one such embodiment, the opening is positioned along the sub-chamber 212 wall between the mesh 224 and the medium 202 (e.g., adjacent to or alternatively though the spacer 226). In some embodiments, openings are positioned at opposite points along the sub-chamber 212 wall (e.g., along those points that would intersect with a diameter line extending through a center of the chamber).

In some embodiments, plasma generated by the photoelectrons can dissociate the lubricant. In one such case involving a vacuum chamber, the vacuum pressure and the electric field can be controlled so that the plasma is not generated within the vacuum chamber.

Figure 3A:
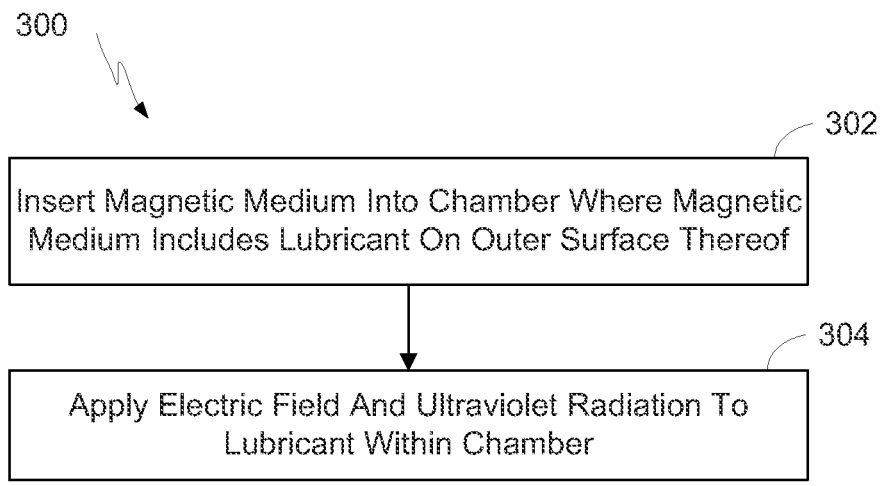
FIG. 3a is a flowchart of a process for forming a lubricant layer for a magnetic medium using a chamber configured to apply both an electric field and ultra violet light to the lubricant layer in accordance with one embodiment of the invention.

FIG. 3a is a flowchart of a process 300 for forming a lubricant layer for a magnetic medium using a chamber configured to apply both an electric field and ultra violet light to the lubricant layer in accordance with one embodiment of the invention. In particular embodiments, the process 300 can be used with the chamber 200 of FIG. 2.

In block 302, the process inserts a magnetic medium into a chamber where the magnetic medium includes a lubricant on an outer surface of the medium. In several embodiments, the lubricant was deposited on the medium before insertion using any of a number of deposition processes (e.g., dipping, vapor deposition, and the like). In several embodiments, the medium was previously formed by providing a substrate for the medium, depositing a magnetic recording layer on the substrate, depositing an overcoat on the magnetic recording layer, and then depositing the lubricant on the overcoat.

In block 304, the process then applies an electric field and an ultraviolet radiation to the lubricant within the chamber. In a number of embodiments, the process applies the electric field and the ultraviolet radiation to the lubricant at exactly the same time or at about the same time. In several embodiments, the process generates the electric field by applying a negative voltage to the medium and applying a positive voltage to an electric mesh spaced apart from the medium. The mesh can be positioned between a UV source for applying the UV radiation and the medium. In several embodiments, a direction of the electric field is into, and about normal to, a top surface of the lubricant. In several embodiments, the applied electric field improves the orientation and bonding of lubricant molecules to the medium overcoat layer.

In several embodiments, the duration of the UV radiation exposure and the duration of the electric field application are each carefully controlled to achieve a desired bonding ratio while minimizing the overall duration of UV exposure. For example, in several embodiments, the electric field is applied slightly before the UV radiation to allow for lubricant molecule orientation before solidification. In one such embodiment, the process heats the medium prior to applying the electric field to help facilitate photoelectron emission.

In some embodiments, it is noted that photoelectron emission generally depends on the UV light energy (wavelength) and light intensity. As such, an acceptable range for the duration of exposure can be determined by calculating the irradiation total energy as described by the multiplication of UV light intensity and the duration time of UV exposure. For example, in one such embodiment, the UV light intensity was measured to be about 5 milliwatts per centimeter squared (mW/cm2) for light with wavelengths of about 185 nanometers (nm) and about 254 nm, where the effective duration time was greater than 100 seconds (s). In such case, an acceptable irradiation total energy is estimated to be greater than about 5 mW times 100 s or about 500 mWs.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 3B:
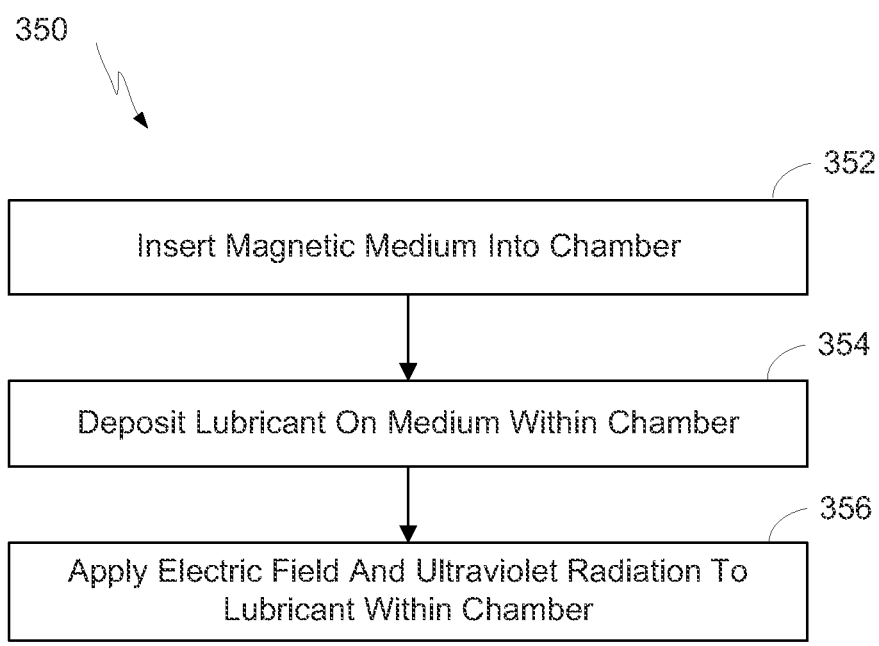
FIG. 3b is a flowchart of a process for forming a lubricant layer for a magnetic medium using a chamber configured to deposit the lubricant layer and apply both an electric field and ultra violet light to the lubricant layer in accordance with one embodiment of the invention.

FIG. 3b is a flowchart of a process 350 for forming a lubricant layer for a magnetic medium using a chamber configured to deposit the lubricant layer and apply both an electric field and ultra violet light to the lubricant layer in accordance with one embodiment of the invention. In particular embodiments, process 350 can be used with a modified version of the chamber 200 of FIG. 2 (e.g., a chamber configured to deposit lubricant on the medium using vapor deposition or another suitable deposition technique compatible with UV radiation and an electric field).

In block 352, the process inserts a magnetic medium into a chamber. In several embodiments, an outer surface of the medium is an overcoat layer made of a carbon based materials such as diamond like carbon (DLC).

In block 354, the process deposits a lubricant on the medium within the chamber. In several embodiments, the lubricant layer is made of perfluoropolyether or other suitable materials. In several embodiments, the deposition is achieved using a vapor deposition sub-process or other suitable deposition sub-process known in the art.

In block 356, the process applies an electric field and an ultraviolet radiation to the lubricant within the chamber. In several embodiments, the electric field and UV radiation can be applied in the various ways discussed above in the descriptions of FIG. 2 and FIG. 3a.

In several embodiments, the process deposits the lubricant on the medium and applies the electric field and the ultraviolet radiation to the lubricant at exactly the same time or at about the same time. In some embodiments, the electric field is applied slightly before the UV radiation to allow for lubricant molecule orientation before solidification. In one such embodiment, the process heats the medium prior to applying the electric field to help facilitate photoelectron emission.

In a number of embodiments, process 350 can be varied in all of the ways discussed above in the description of FIG. 3a for process 300.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 4A:
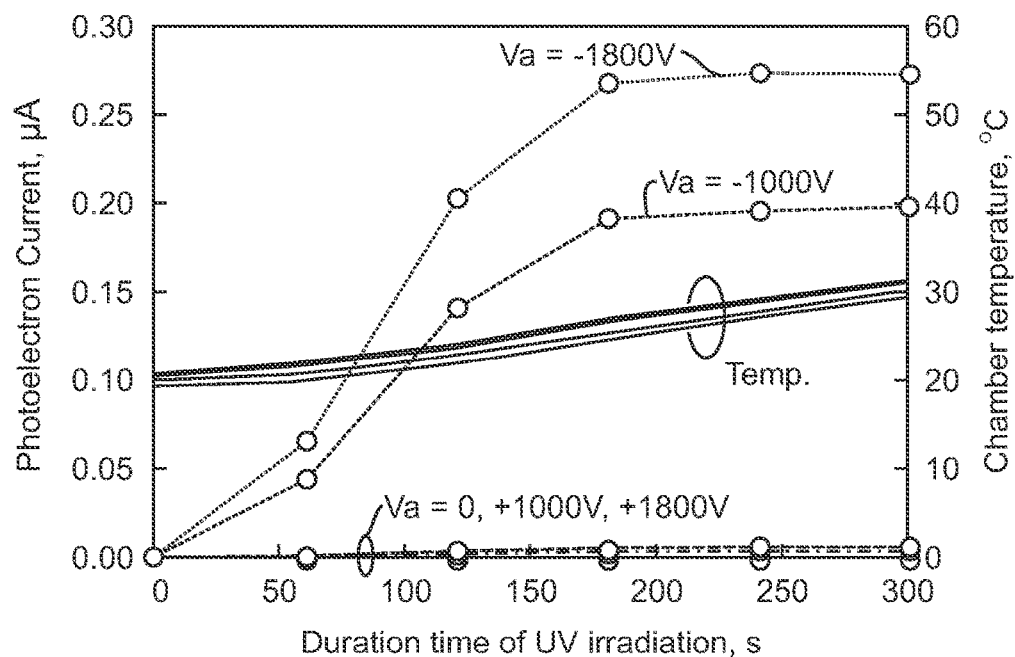
FIG. 4a is a schematic graph of current corresponding to photoelectron emission during the application of an electric field and ultra violet (UV) light to a lubricant layer of a magnetic medium versus the application time of the UV light up to 300 seconds in accordance with one embodiment of the invention.
Figure 4B:
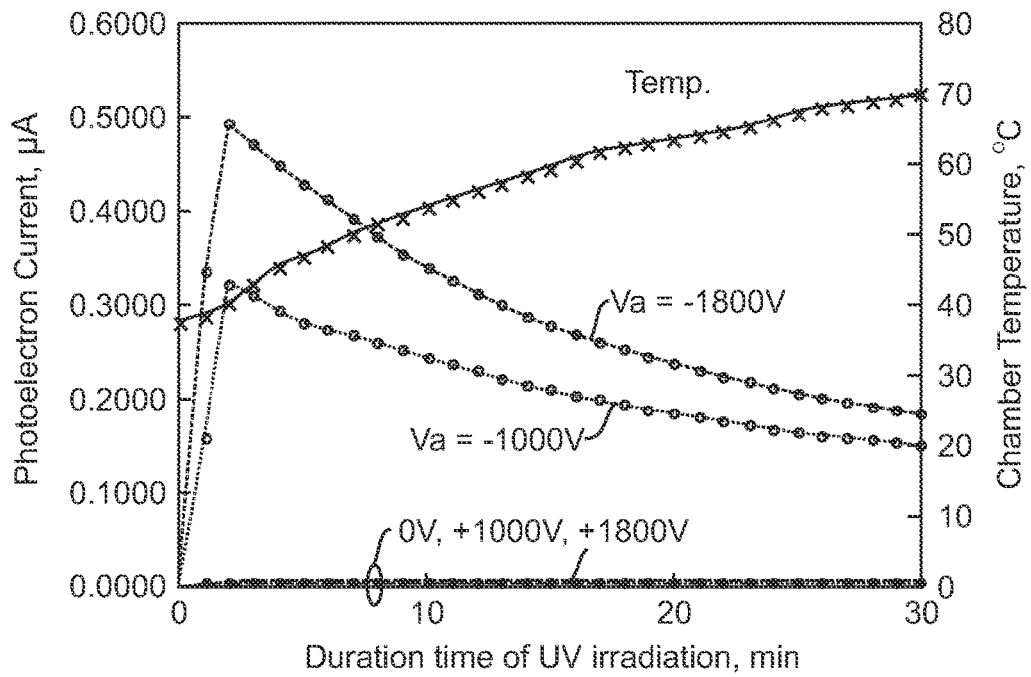
FIG. 4b is a schematic graph of current corresponding to photoelectron emission during the application of an electric field and ultra violet (UV) light to a lubricant layer of a magnetic medium versus the application time of the UV light up to 30 minutes in accordance with one embodiment of the invention.

FIG. 4a is a schematic graph of current corresponding to photoelectron emission during the application of an electric field and ultra violet (UV) light to a lubricant layer of a magnetic medium versus the application time of the UV light up to 300 seconds in accordance with one embodiment of the invention. The graph illustrates curves fit to data points where the fitted curves correspond to applied voltages (Va) of −1800 volts (V), −1000 V, 0 V, +1000 V, and +1800 V. As can be seen in FIG. 4a, the applied voltage of −1800 V causes the highest photoelectron emission current, and the applied voltages of 0 V, +1000 V, and +1800 V cause comparatively negligible photoelectron emission current. The graph also shows the temperature of the chamber during application of the UV radiation and electric field. In one embodiment, the graph of FIG. 4a can be viewed as an illustration of the photoelectron emission current as measured by the chamber system of FIG. 2 and corresponding to the process of FIG. 3a. FIG. 4b is a schematic graph of current corresponding to photoelectron emission during the application of an electric field and ultra violet (UV) light to a lubricant layer of a magnetic medium versus the application time of the UV light up to 30 minutes in accordance with one embodiment of the invention. As compared to FIG. 4a, the graph of FIG. 4b shows the photoelectron emission current over a longer duration extending up to 30 minutes. Similar to the graph of FIG. 4a, the graph of FIG. 4b shows the photoelectron emission current is greatly increased by applying the electric field during UV radiation where the applied voltage includes application of a relatively high negative voltage to the disk (e.g., such that the electric field is directed into the top surface of the lubricant). In one embodiment, the graph of FIG. 4*b* can be viewed as an illustration of the photoelectron emission current as measured by a modified chamber system (e.g., similar to that of FIG. 2 with the capability to support vapor deposition of the lubricant) and corresponding to the process of FIG. 3*b*.

From experiments involving the chamber 200 and subchamber 212 of FIG. 2, the inventors concluded that photoelectron emission can be accelerated by applying an electric field to the disk surface, and in particular a relatively high negative voltage to the disk, during UV radiation as shown in FIGS. 4*a* and 4*b*.

In one embodiment, the graph can be thought of as illustrating the photoelectron current in the case of vapor deposition combined with application of the electric field and the UV light. In such case, the graph can be thought of as showing that photoelectron current gradually decreased as the vapor deposited lubricant film thickness increased during UV irradiation time.

It is also noted that photoelectron current generally depends on the temperature of disk surface and the pressure in the chamber, where the pressure is increased at high temperature and in high vacuum. Thus, in some embodiments, it can be desirable to control temperature and pressure for optimization of lubricant film.

Figure 5:
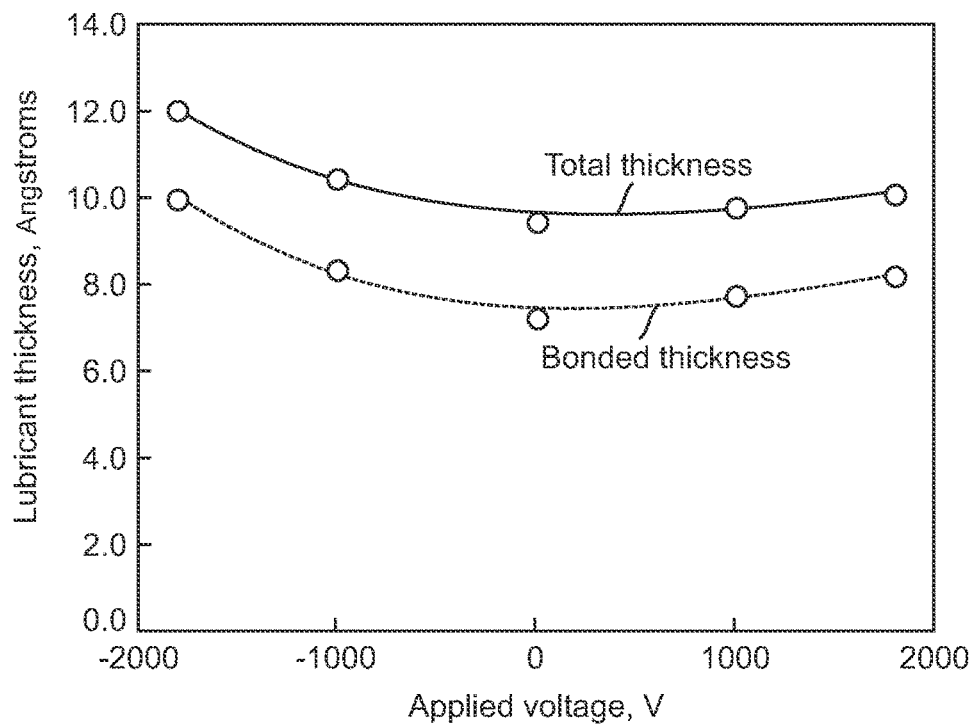
FIG. 5 is a schematic graph of lubricant thickness after the application of an electric field and ultra violet (UV) light to a lubricant layer of a magnetic medium versus the applied voltage of the electric field in accordance with one embodiment of the invention.

FIG. 5 is a schematic graph of lubricant thickness after the application of an electric field and ultra violet (UV) light to a lubricant layer of a magnetic medium versus the applied voltage of the electric field in accordance with one embodiment of the invention. The graph of FIG. 5 shows both bonded thickness and total thickness, where total thickness is the lubricant thickness after the UV radiation and electric field are applied and the bonded thickness is the lubricant thickness after the UV radiation and electric field are applied along with a solvent. FIG. 5 also shows that a relatively large negative voltage causes increased bonding thickness for the same amount of lubricant (e.g., more effective lubricant bonding results from the large negative voltage to the medium/disk and corresponding electric field).

Figure 6:
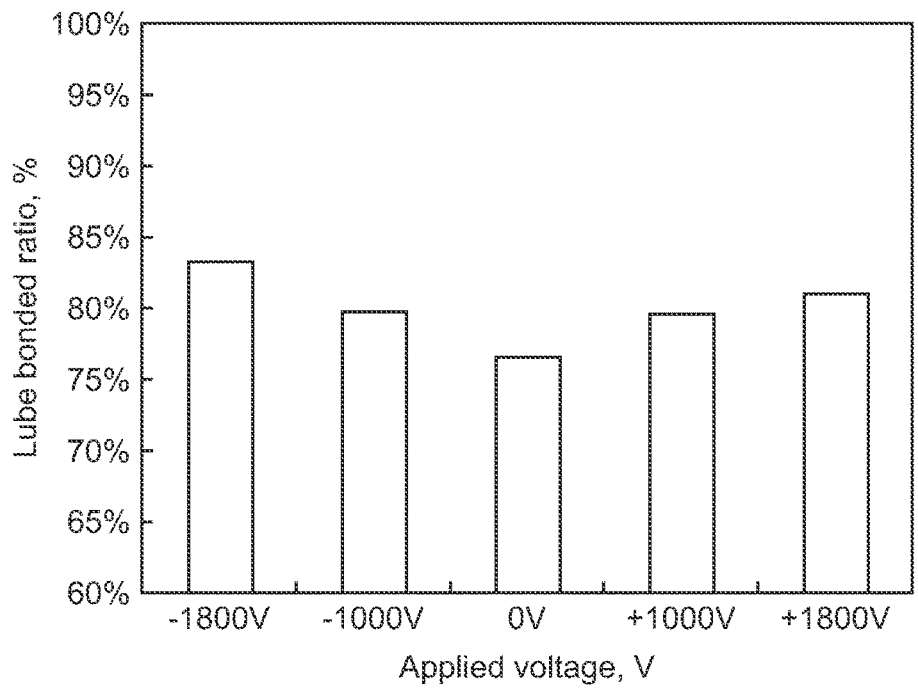
FIG. 6 is schematic bar graph of a lube bonded ratio for a magnetic medium having an improved lubricant layer having been deposited with application of an electric field and ultra violet (UV) light versus an applied voltage of the electric field in accordance with one embodiment of the invention.

FIG. 6 is schematic bar graph of a lube bonded ratio for a magnetic medium having an improved lubricant layer having been deposited with application of an electric field and ultra violet (UV) light versus an applied voltage of the electric field in accordance with one embodiment of the invention. Among other things, the graph of FIG. 6 shows that for a lubricant layer of a medium with the same UV radiation applied with different levels of an applied electric field, the applied voltage of −1800V for the electric field results in the highest percentage for the bonded ratio. Use of the high negative applied voltage (e.g., −1800 V or volts) can thus be used to shorten the UV application time to achieve a desired level of lubricant bonding.

Figure 8:
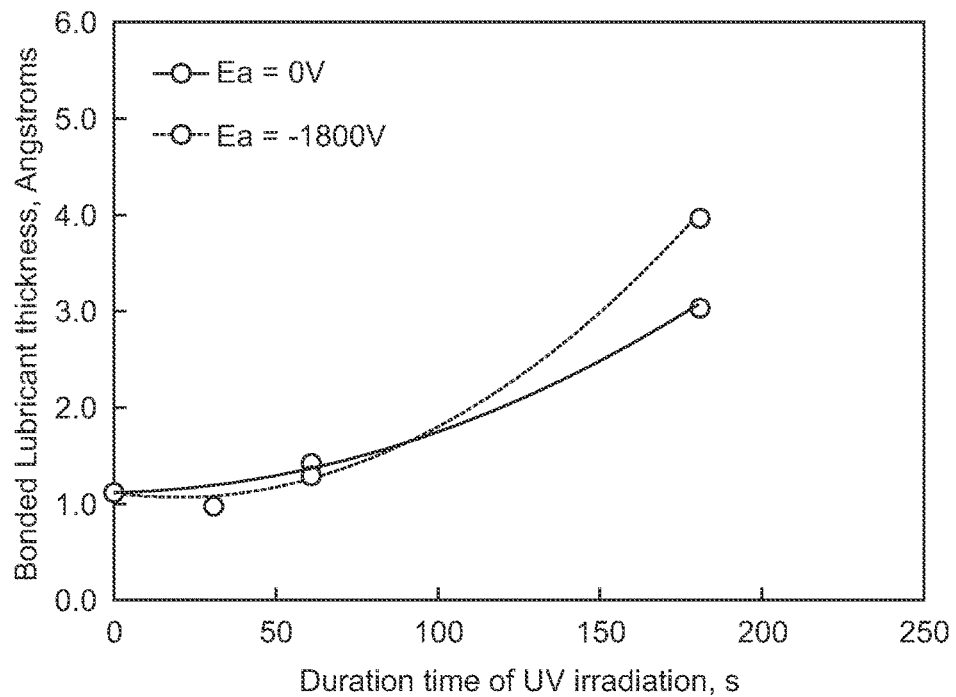
FIG. 8 is a schematic graph of bonded lubricant thickness during the application of an electric field and ultra violet (UV) light to a lubricant layer of a magnetic medium versus the duration of the UV light in accordance with one embodiment of the invention.

The inventors have also determined that the interaction between the photoelectrons and lubricant molecules increase the bonding thickness of lubricant film as shown in FIG. 5 and FIG. 8. Aspects of the invention can thus involve improving the controllability of bonded thickness of lubricant film in a UV irradiation process as shown in FIG. 6. Aspects of the invention involve the observation that the improved lubricant film should reduce lubricant pick-up and slider wear.

Figure 7:
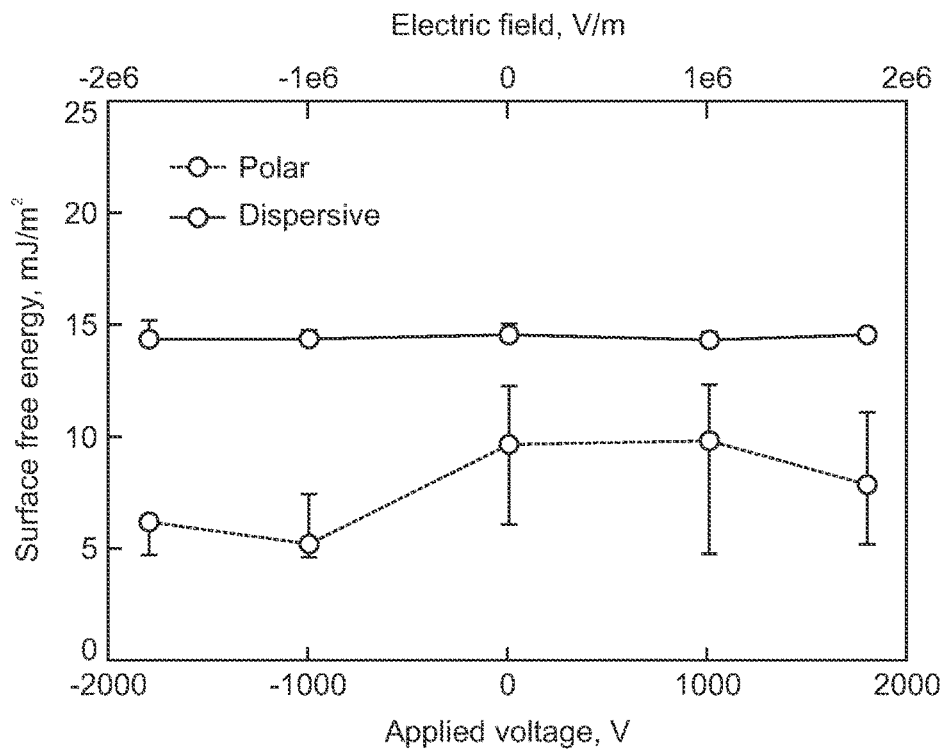
FIG. 7 is a schematic graph of the polar surface free energy of a lubricant coated magnetic medium/disk during the application of an electric field and ultra violet (UV) light to the lubricant layer versus the applied voltage of the electric field in accordance with one embodiment of the invention.

FIG. 7 is a schematic graph of the polar surface free energy of a lubricant coated magnetic medium/disk during the application of an electric field and ultra violet (UV) light to the lubricant layer versus the applied voltage of the electric field in accordance with one embodiment of the invention. The graph of FIG. 7 shows that the polar surface free energy is generally greater than the dispersive surface free energy and varies less than the dispersive surface free energy even with different applied voltages for the electric field. The graph of FIG. 7 also shows that the dispersive surface free energy appears to be lower at the negative applied voltage as compared to the dispersive surface free energy for applied voltages that are for 0 V or greater.

FIG. 8 is a schematic graph of bonded lubricant thickness during the application of an electric field and ultra violet (UV) light to a lubricant layer of a magnetic medium versus the duration of the UV light in accordance with one embodiment of the invention. The graph of FIG. 8 shows that after about 90 seconds of UV radiation, the bonded lubricant thickness of the medium for an applied electric field voltage of −1800 V is greater than that of no electric field or 0 V.

Figure 9:
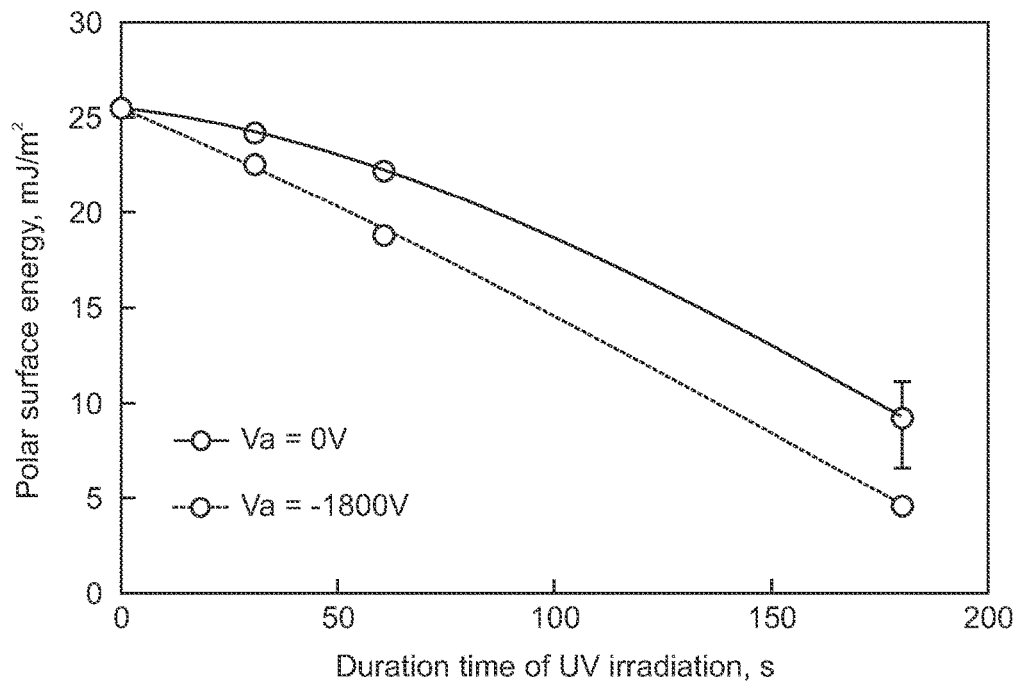
FIG. 9 is a schematic graph of the polar surface free energy of a lubricant coated magnetic medium/disk during the application of an electric field and ultra violet (UV) light to the lubricant layer versus the duration of the UV light in accordance with one embodiment of the invention.

FIG. 9 is a schematic graph of the polar surface free energy of a lubricant coated magnetic medium/disk during the application of an electric field and ultra violet (UV) light to the lubricant layer versus the duration of the UV light in accordance with one embodiment of the invention. The graph of FIG. 9 shows that the polar surface energy for an applied electric field (e.g., Va=−1800 V) on the medium is less than that for no applied electric field (e.g., Va=0 V) for a duration of up to about 180 seconds of UV radiation.

Figure 10:
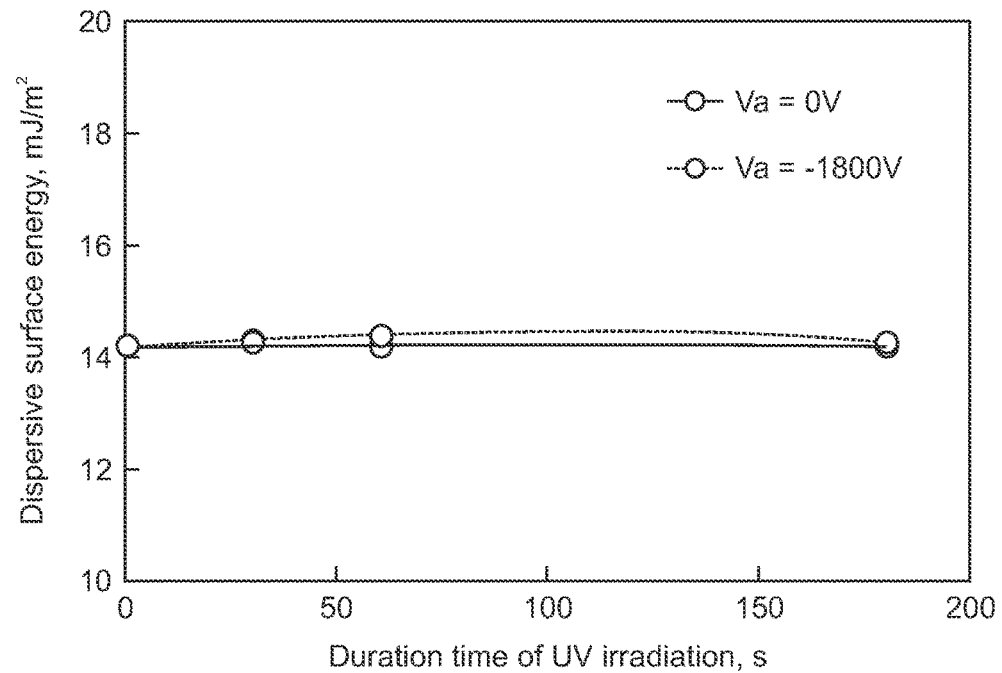
FIG. 10 is a schematic graph of the dispersive surface free energy of a lubricant coated magnetic medium/disk during the application of an electric field and ultra violet (UV) light to the lubricant layer versus the duration of the UV light in accordance with one embodiment of the invention.

FIG. 10 is a schematic graph of the dispersive surface free energy of a lubricant coated magnetic medium/disk during the application of an electric field and ultra violet (UV) light to the lubricant layer versus the duration of the UV light in accordance with one embodiment of the invention. The graph of FIG. 10 shows that the dispersive surface energy for an applied electric field (e.g., Va=−1800 V) on the medium is slightly greater than that for no applied electric field (e.g., Va=0 V) for a duration of up to about 180 seconds of UV radiation.

In a number of applications, controlling the bonding percentage in a lubricant layer can be important for reducing lubricant evaporation, lubricant depletion and lubricant pick-up. Aspects of this invention involve controlling it by changing the applied voltage that generates the electric field on the lubricant layer. Furthermore, applying the electric field can make random coiled lubricant molecules detangled, achieve high density, and achieve uniformity and high conformity in the lubricant layer, as the figures discussed above illustrate. These benefits can also include, or possibly result in, HDI (head to disk interface) clearance improvements. In several embodiments, a resulting uniform bonding layer can reduce head wear. In addition to these advantages, by enhancing emission efficiency of photoelectrons from a carbon overcoat by applying an electric field and UV at the same time, the UV exposure time can be reduced thereby improving process cycle time (PPH) while reducing decomposition damage to lubricant molecules. In several embodiments, aspects of this invention can be applied to vapor lubrication processes, and can be important technology for HAMR media manufacturing.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A method for forming a lubricant layer for a magnetic medium for a storage device, the method comprising:
    inserting a magnetic medium into a chamber, the magnetic medium comprising a layer formed on an outer surface thereof prior to inserting the magnetic medium into the chamber, wherein the layer consists of a lubricant;
    independently applying an electric field and an ultraviolet radiation to the lubricant within the chamber; and
    controlling the electric field such that a plasma is not generated within the chamber.

2. The method of claim 1, wherein the applying the electric field and the ultraviolet radiation to the lubricant are initiated at about the same time.

3. The method of claim 1, further comprising:
    applying a negative voltage to the medium to apply the electric field to the lubricant within the chamber.

4. The method of claim 1, wherein a direction of the electric field is into, and about normal to, a top surface of the lubricant.

5. The method of claim 1:
    applying a negative voltage to the medium to apply the electric field to the lubricant within the chamber, wherein the chamber comprises:
        a source of the ultraviolet (UV) radiation; and
        a mesh positioned between the UV source and the medium; and
    applying a positive voltage to the mesh to apply the electric field to the lubricant within the chamber.

6. The method of claim 5, wherein the mesh comprises a shape configured to generate the electric field and to allow the UV radiation to penetrate the mesh.

7. The method of claim 6, wherein the mesh comprises a grid shape.

8. The method of claim 5:
    wherein the medium and the mesh are spaced apart and about parallel;
    wherein the chamber further comprises an insulator positioned between the medium comprising the lubricant and the mesh; and
    wherein the insulator and the medium at least partially overlap.

9. The method of claim 8, wherein the chamber further comprises:
    a base portion, wherein the medium is on, and electrically coupled to, the base portion;
    a cover portion on the mesh, wherein the mesh is electrically coupled to the cover portion; and
    a voltage source having a positive terminal electrically coupled to the cover portion and a negative terminal electrically coupled to the base portion,
    wherein the insulator is positioned between the base portion and the cover portion.

10. The method of claim 1, wherein the inserting the magnetic medium into the chamber comprises:
    providing a substrate for the medium;
    depositing a magnetic recording layer on the substrate;
    depositing an overcoat on the magnetic recording layer;
    depositing the lubricant on the overcoat; and
    inserting the magnetic medium into the chamber.

11. The method of claim 1, wherein the independently applying the electric field and the ultraviolet radiation to the lubricant within the chamber comprises:
    heating the magnetic medium to a preselected temperature; and
    independently applying the electric field and the ultraviolet radiation to the lubricant within the chamber.

12. The method of claim 1, wherein the applying the electric field and the ultraviolet radiation to the lubricant within the chamber comprises:
    applying the electric field to the lubricant within the chamber for a first preselected duration; and
    applying ultraviolet radiation to the lubricant within the chamber for a second preselected duration subsequent to the first preselected duration.

13. The method of claim 12, wherein the applying the electric field to the lubricant within the chamber for the first preselected duration comprises:
    applying the electric field to the lubricant within the chamber for the first preselected duration without heating the medium.

14. The method of claim 1, wherein the lubricant comprises perfluoropolyether.

15. A method for forming a lubricant layer for a magnetic medium for a storage device, the method comprising:
    inserting a magnetic medium into a chamber, wherein the chamber comprises:
        a source of ultraviolet (UV) radiation;
        a mesh positioned between the UV source and the medium; and
        an insulator positioned between the medium and mesh, wherein the insulator and the medium at least partially overlap;
    depositing a layer on the medium within the chamber, wherein the layer consists of a lubricant;
    applying an electric field and an ultraviolet radiation to the lubricant within the chamber; and
    controlling the electric field such that a plasma is not generated within the chamber.

16. The method of claim 15:
    wherein the depositing the lubricant on the medium and the applying the electric field and the ultraviolet radiation to the lubricant are initiated at about the same time.

17. The method of claim 15, further comprising:
    applying a negative voltage to the medium to apply the electric field to the lubricant within the chamber.

18. The method of claim 15, wherein a direction of the electric field is into, and about normal to, a top surface of the lubricant.

19. The method of claim 15:
    applying a negative voltage to the medium to apply the electric field to the lubricant within the chamber; and
    applying a positive voltage to the mesh to apply the electric field to the lubricant within the chamber.

20. The method of claim 15, wherein the mesh comprises a shape configured to generate the electric field and to allow the UV radiation to penetrate the mesh.

21. The method of claim 20, wherein the mesh comprises a grid shape.

22. The method of claim 15:
wherein the medium and the mesh are spaced apart and about parallel.

23. The method of claim 15, wherein the chamber further comprises:
a base portion, wherein the medium is on, and electrically coupled to, the base portion;
a cover portion on the mesh, wherein the mesh is electrically coupled to the cover portion; and
a voltage source having a positive terminal electrically coupled to the cover portion and a negative terminal electrically coupled to the base portion,
wherein the insulator is positioned between the base portion and the cover portion.

24. The method of claim 15:
wherein the inserting the magnetic medium into the chamber comprises:
providing a substrate for the medium;
depositing a magnetic recording layer on the substrate;
depositing an overcoat on the magnetic recording layer;
inserting the magnetic medium into the chamber; and
wherein the depositing the lubricant on the medium within the chamber comprises depositing the lubricant on the overcoat within the chamber.

25. The method of claim 15, wherein the applying the electric field and the ultraviolet radiation to the lubricant within the chamber comprises:
heating the magnetic medium to a preselected temperature; and
applying the electric field and the ultraviolet radiation to the lubricant within the chamber.

26. The method of claim 15, wherein the applying the electric field and the ultraviolet radiation to the lubricant within the chamber comprises:
applying the electric field to the lubricant within the chamber for a first preselected duration; and
applying ultraviolet radiation to the lubricant within the chamber for a second preselected duration subsequent to the first preselected duration.

27. The method of claim 26, wherein the applying the electric field to the lubricant within the chamber for the first preselected duration comprises:
applying the electric field to the lubricant within the chamber for the first preselected duration without heating the medium.

28. The method of claim 15, wherein the lubricant comprises perfluoropolyether.

* * * * *